US009087753B2

(12) United States Patent
Lin et al.

(10) Patent No.: US 9,087,753 B2
(45) Date of Patent: *Jul. 21, 2015

(54) PRINTED TRANSISTOR AND FABRICATION METHOD

(75) Inventors: Qinghuang Lin, Yorktown Heights, NY (US); Minhua Lu, Yorktown Heights, NY (US); Robert L. Wisnieff, Ridgefield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 424 days.

This patent is subject to a terminal disclaimer.

(21) Appl. No.: 13/468,576

(22) Filed: May 10, 2012

(65) Prior Publication Data

US 2013/0299883 A1 Nov. 14, 2013

(51) Int. Cl.
*H01L 23/48* (2006.01)
*H01L 23/52* (2006.01)
*H01L 27/12* (2006.01)
*H01L 29/786* (2006.01)
*H01L 29/66* (2006.01)
H01L 23/532 (2006.01)
H01L 51/00 (2006.01)

(52) U.S. Cl.
CPC ...... *H01L 27/1292* (2013.01); *H01L 29/66969* (2013.01); *H01L 29/7869* (2013.01); *H01L 23/532* (2013.01); *H01L 51/0004* (2013.01)

(58) Field of Classification Search
CPC .............. H01L 27/1292; H01L 23/532; H01L 29/7869
USPC .......................................... 257/759, 734, 762
See application file for complete search history.

(56) References Cited

U.S. PATENT DOCUMENTS

| 5,913,113 | A | 6/1999 | Seo |
|---|---|---|---|
| 6,037,195 | A | 3/2000 | Toriyama et al. |
| 6,337,278 | B1 * | 1/2002 | Butler ........................... 438/689 |
| 6,737,708 | B2 * | 5/2004 | Zhang et al. ................... 257/355 |
| 7,041,748 | B2 | 5/2006 | Lin et al. |
| 7,056,840 | B2 | 6/2006 | Miller et al. |
| 7,235,473 | B2 * | 6/2007 | Jawarani et al. .............. 438/592 |
| 7,306,853 | B2 | 12/2007 | Lin et al. |
| 7,566,598 | B2 | 7/2009 | Wu et al. |
| 7,709,370 | B2 | 5/2010 | Allen et al. |
| 7,919,225 | B2 | 4/2011 | Allen et al. |
| 7,968,382 | B2 * | 6/2011 | Jinbo et al. .................... 438/149 |
| 8,029,971 | B2 | 10/2011 | Allen et al. |
| 8,084,862 | B2 | 12/2011 | Lin et al. |
| 8,236,599 | B2 * | 8/2012 | Chang et al. ..................... 438/72 |
| 8,586,404 | B2 * | 11/2013 | Huang et al. ..................... 438/98 |

(Continued)

*Primary Examiner* — Nicholas Tobergte
(74) *Attorney, Agent, or Firm* — Tutunjian & Bitetto, P.C.; Louis J. Percello

(57) ABSTRACT

A method for fabricating a thin film transistor includes printing source, drain and channel regions on a passivated transparent substrate, forming a gate dielectric over the channel region and forming a gate conductor over the gate dielectric. A permanent antireflective coating is deposited over the source region, drain region and gate electrode, and an interlevel dielectric layer is formed over the permanent antireflective coating. Openings in the permanent antireflective coating and the interlevel dielectric layer are formed to provide contact holes to the source region, drain region and gate electrode. A conductor is deposited in the contact holes to electrically connect to the source region, drain region and gate electrode. Thin film transistor devices and other methods are also disclosed.

13 Claims, 3 Drawing Sheets

(56) References Cited

U.S. PATENT DOCUMENTS

| | | |
|---|---|---|
| 2009/0079076 A1 | 3/2009 | Lin et al. |
| 2009/0166612 A1* | 7/2009 | Cain et al. .................. 257/40 |
| 2009/0174067 A1* | 7/2009 | Lin .................. 257/734 |
| 2012/0261829 A1* | 10/2012 | Lin et al. .................. 257/774 |

* cited by examiner

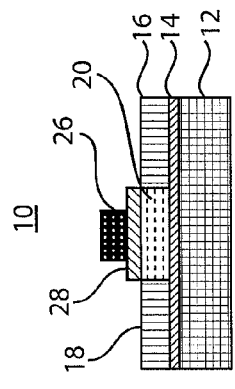
FIG. 1
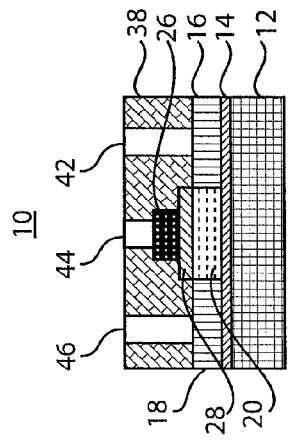
FIG. 2
FIG. 3
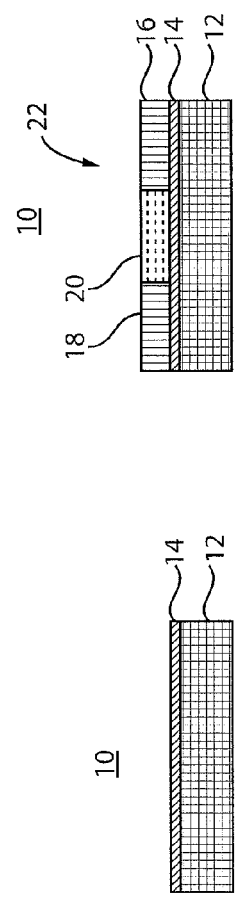
FIG. 4
FIG. 4A
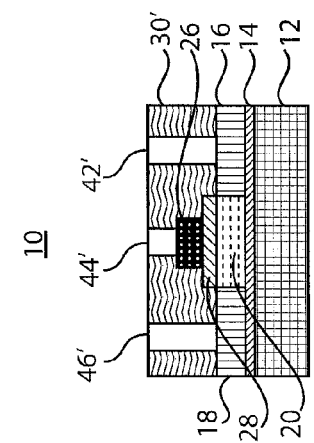
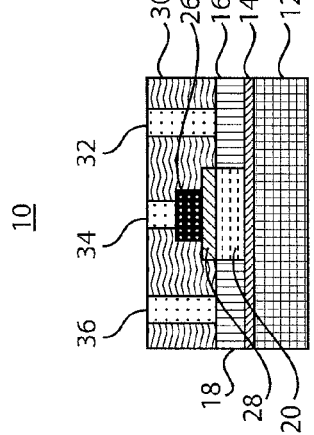
FIG. 5

PRINTED TRANSISTOR AND FABRICATION METHOD

RELATED APPLICATION INFORMATION

This application is related to commonly assigned application Ser. No. 13/088,054, entitled: INTERCONNECT STRUCTURE AND METHOD FOR FABRICATING ON-CHIP INTERCONNECT STRUCTURES BY IMAGE REVERSAL; commonly assigned application Ser. No. 13/088,083, entitled: SELF-ALIGNED AIRGAP INTERCONNECT STRUCTURES AND METHODS OF FABRICATION, and commonly assigned application Ser. No. 13/088,110, entitled: MIDDLE OF LINE STRUCTURES AND METHODS FOR FABRICATION, all filed concurrently on Apr. 15, 2011 and incorporated herein by reference.

BACKGROUND

1. Technical Field

The present invention relates to thin film processing, and more particularly to thin film transistors and related devices fabricated using a printing process.

2. Description of the Related Art

Thin film transistors are often employed in display devices, such as liquid crystal displays and the like. Many processes employed in the fabrication of thin film transistors include dry chemical vapor deposition (CVD) or similar deposition processes. Dry CVD processes require high temperatures and costly fabrication tools. In addition, the process sequences are extensive, resulting in complex film stacks and process flows. These aspects of conventional thin film transistor (TFT) processing contribute to high manufacturing cost. Further, the complex processes and structures become prone to defect introduction due to the many films and the processing steps employed.

SUMMARY

A method for fabricating a thin film transistor includes printing source, drain and channel regions on a passivated transparent substrate, forming a gate dielectric over the channel region and forming a gate conductor over the gate dielectric. A permanent antireflective coating is deposited over the source region, drain region and gate electrode, and an interlevel dielectric layer is formed over the permanent antireflective coating. Openings in the permanent antireflective coating and the interlevel dielectric layer are formed to provide contact holes to the source region, drain region and gate electrode. A conductor is deposited in the contact holes to electrically connect to the source region, drain region and gate electrode.

Another method for fabricating a thin film transistor includes printing source, drain and channel regions on a passivated transparent substrate; forming a gate dielectric over the channel region; forming a gate conductor over the gate dielectric; forming an interlevel dielectric layer from a photo-patternable low dielectric constant (PPLK) material; curing the PPLK material in the interlevel dielectric layer to provide a permanent dielectric layer; forming openings in the interlevel dielectric layer to provide contact holes to the source region, drain region and gate electrode; and depositing a conductor in the contact holes to electrically connect to the source region, drain region and gate electrode.

A thin film transistor includes source, drain and channel regions printed on a passivated transparent substrate. A gate dielectric is formed over the channel region, and a gate conductor is formed over the gate dielectric. A permanent antireflective coating is formed over the source region, drain region and gate electrode. An interlevel dielectric layer is formed over the permanent antireflective coating. The permanent antireflective coating and the interlevel dielectric layer are configured to provide holes for contacting the source region, drain region and gate electrode. Contacts are formed through the interlevel dielectric layer and the permanent antireflective coating to electrically connect to the source region, drain region and gate electrode.

Another thin film transistor includes source, drain and channel regions printed on a passivated transparent substrate, a gate dielectric formed over the channel region and a gate conductor formed over the gate dielectric. An interlevel dielectric layer is formed over the source region, drain region and gate electrode from a cured photo-patternable low dielectric constant (PPLK) material to form a permanent interlevel dielectric layer having a unitary form that is configured with reverse image openings. Contacts are formed through the permanent interlevel dielectric layer in the reverse image openings to electrically connect to the source region, drain region and gate electrode.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 is a cross-sectional view showing a passivated substrate in accordance with the present principles;

FIG. 2 is a cross-sectional view showing printed source, drain and channel regions formed on the passivated substrate of FIG. 1 in accordance with the present principles;

FIG. 3 is a cross-sectional view showing a gate dielectric and gate electrode formed on the channel region of FIG. 2 in accordance with the present principles;

FIG. 4 is a cross-sectional view showing an interlevel dielectric layer formed on the structure of FIG. 3 and having contact holes etched down to the gate electrode, source region and drain region in accordance with the present principles;

FIG. 4A is a cross-sectional view showing an interlevel dielectric layer formed from a photo-patternable low dielectric constant material deposited over resist features formed on the structure of FIG. 3, the resist features to be decomposed and removed to form contact holes down to the gate electrode, source region and drain region in accordance with the present principles;

FIG. 5 is a cross-sectional view showing a permanent interlevel dielectric layer with contact holes formed down to the gate electrode, source region and drain region in accordance with the present principles;

DETAILED DESCRIPTION OF PREFERRED EMBODIMENTS

Figure 7:
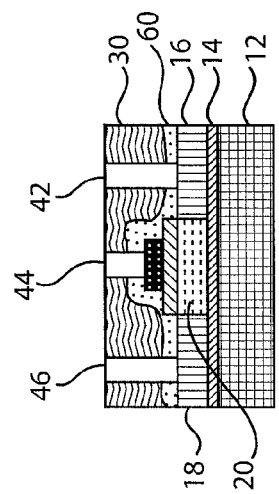
FIG. 7 is a cross-sectional view showing an interlevel dielectric layer formed on the structure of FIG. 3 and having an anti-reflection coating formed on the gate electrode, source region and drain region in accordance with the present principles.

In accordance with the present principles, thin film transistor (TFT) device structures and methods for their fabrication are provided. The present disclosure provides reduced fabrication steps for TFTs and their related structures, such as capacitors, wiring, pixel electrodes, etc., which may be referred to herein as thin structures. In particularly useful embodiments, the thin structures may be employed for liquid crystal displays, for monitors, display screens, cellular phones (such as, smart phones), personal digital assistants, handheld computers including specialty equipment, etc.

In one embodiment, a printing process is employed in accordance with the present principles to reduce fabrication processing and manufacturing costs of thin film transistors for liquid crystal displays. The printing process improves the quality of thin film transistors, e.g., by minimizing missed pixels and other structures. The printing processes enable the use of liquid precursors, which provide additional flexibility for device shapes, structures and compatibility with flexible substrates.

It is to be understood that the present invention will be described in terms of a given illustrative architecture having a substrate and devices employed in liquid crystal displays; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip or display device may be created in a graphical computer programming language, and stored in a computer storage medium (such as a disk, tape, physical hard drive, or virtual hard drive such as in a storage access network). If the designer does not fabricate chips/displays or the patterns or masks used to fabricate chips/displays, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of lithographic masks, which typically include multiple copies of the design in question that are to be formed on a wafer or substrate. The masks are utilized to define areas of the wafer or substrate (and/or the layers thereon) to be etched or otherwise processed.

Methods as described herein may be used in the fabrication of integrated circuit chips or displays. The resulting integrated circuit chips or displays can be distributed by the fabricator in as a display screen or in a packaged form as part of a display including sealed in liquid crystal material. In the latter case, the display is mounted in a package with electrical connections which can be connected to a motherboard or other device. In any case, the display may be integrated with other chips, discrete circuit elements, and/or other signal processing devices as part of either (a) an intermediate product, such as a printed wiring board, or (b) an end product. The end product can be any product that ranging from toys and other low-end applications to advanced computer products.

Referring now to the drawings in which like numerals represent the same or similar elements and initially to FIG. 1, a cross-sectional view of a partially fabricated thin film transistor (TFT) device 10 shows a passivation layer 14 formed on a substrate 12. Substrate 12 preferably includes a transparent material, such as, glass, quartz, plastic or other suitable materials. Passivation layer 14 may include a silicon oxide or other material compatible with the substrate 12 material. The passivation layer 14 may be grown by oxidation of the substrate 12 or may be deposited using a deposition process, (e.g., CVD). The device 10 is now ready for the formation of sources, drains ad channel regions, which are provided using a printing process.

Referring to FIG. 2, semiconductor materials 22 are formed on the passivation layer 14. The semiconductor materials 22 may be patterned to form source regions 16, drain regions 18 and channel regions 20. In one particularly useful embodiment, the semiconductor materials 22 are formed by a printing method. The printing method may include a relief printing method, a reverse type offset printing method, an ink jet printing method, a screen printing method, nanoimprint, embossing, micro contact printing, replica molding, microtransfer molding, solvent-assisted micromolding, and thermal assisted embossing. Other deposition methods may include spray coating or spin coating. The printing method is preferably a process that is inexpensively performed at a low temperature, and the number of process steps is low.

In particularly useful embodiments, the semiconductor materials 22 may include polymer/organic semiconductor materials such as polythiophene, polyallylamine, fluorene BT [2,2'-bithiophene]copolymer and derivatives, and low molecular system organic semiconductor materials such as pentacene, tetracene, perylene, copper phthalocyanine, and derivatives. In other useful embodiments, the semiconductor materials 22 may include spin-on inorganic semiconductor materials or inorganic materials that can be converted into inorganic semiconductors. Examples include spin-on silicon, spin-on silane, spin-on semiconductor oxide (amorphous In—Ga—Zn—O system), metal chalcogenide ($SnS_{2-x}Se_x$) and the like.

In one embodiment, the device 10 may be flexible and include a flexible substrate 12. If the device 10 is flexible, an organic semiconductor material which can be applied using a printing method is preferable. Carbon compounds such as carbon nanotubes (CNT), fullerene, and semiconductor nanoparticle dispersions may also be employed for semiconductor materials 22. The source regions 16, drain regions 18 and channel regions 20 may be printed concurrently or may be printed in separate steps using the same or different materials. The source regions 16, drain regions 18 and channel regions 20 may be formed having different shapes and configurations, e.g., rectangular, trapezoidal, etc.

After printing, a curing process may be employed to drive out any remaining solvents present in the printed layers. Such solvents may absorb moisture and affect dimensional stability of the semiconductor materials 22. The curing process can be selected from heat treatment, irradiation by electromagnetic waves (such of ultra-violet light), irradiation by particle beam (such as an electron beam, or an ion beam), plasma treatment, chemical treatment through a gas phase or a liquid phase (such as application of a monolayer of surface modifier) or any combination thereof. The curing process is preferably a low temperature process, e.g., 60 degrees C. to 200 degrees C., for between about 20 seconds to about a minute. Other curing processes may be employed.

Referring to FIG. 3, a gate dielectric 28 is formed over the channel regions 20 of the device 10. The gate dielectric 28 may include, for example, silicon nitride, silicon oxide, silicon oxynitride, aluminum oxide, tantalum oxide, plasma deposited or reactively sputtered silicon oxide (SiOx), spin-on-glass, organic materials, such as, polyamide, or high-k dielectrics, such as, Barium Strontium Titanium oxide (BST), Barium Zirconium Titanium oxide (BZT), and tantalum pentoxide or combinations thereof. Gate dielectric 28 may include multi-layers, for example, $SiN_x$, $SiN_x/SiOy$, $SiN_x/SiOy/SiN_x$. These layers may be prepared by anodization and/or by plasma enhanced chemical vapor deposition (PECVD), electron cyclotron resonance CVD, laser-assisted CVD, or sputtering.

In a particularly useful embodiment, the gate dielectric 28 includes printable dielectric material. Examples of generally used materials include organic materials such as poly vinylphenol, polymethyl methacrylate, polyimide, polyvinyl alcohol and epoxy resin, and inorganic materials silicon oxide, silicon nitride, alumina and silicagel.

If the gate dielectric layer 28 is deposited other than by printing, a layer of resist (not shown) may be formed on dielectric layer 28. The resist may include a chemically amplified photoresist, non-chemically amplified photoresist, a positive-tone or negative tone resist. The resist may include a photo-patternable polyimide or other lithographically patternable material. The resist is employed to form a mask for etching the dielectric layer to leave a portion of the dielectric layer to form the gate dielectric 28. A gate electrode 26 is formed by a metal or conductor deposition and patterned lithographically. Gate electrode 26 is preferably formed from an opaque material and may be a single conductive layer of a metal such as chromium (Cr), tungsten (W), aluminum (Al), copper (Cu) and other electrically equivalent conductors, a multilayer structure of metals in a capped or clad arrangement, such as, chromium above and/or below Al (Cr/Al), Molybdenum above and/or below Al (Mo/Al), and other similar conductors, and alloy structures, including, for example, several percent of Neodymium in Aluminum, etc. It should be understood that the gate dielectric 28 and the gate electrode 26 may also be provided by a printing method using suitable dielectric and conductive materials.

Referring to FIG. 4, a reversed-tone mask and a positive- or negative-tone photoresist are employed to form features 32, 34 and 36 to form an inverse or reverse image mask for forming contact holes (42, 44, 46, FIG. 5). The features 32, 34 and 36 are employed to exclude material from contact holes rather than etching the contact holes. Since the photoresist features 32, 34 and 36 are patterned using lithographic methods, the pattern features 110 may be formed with a plurality of different shapes. After exposure and post-exposure baking, latent images or patterns are developed into relief images or patterns 32, 34 and 36 with an appropriate developer, usually an aqueous base solution, such as, e.g., 0.26N tetramethylammoniahydroxide (TMAH) solution. Other developers may be employed.

An interlevel dielectric (ILD) 30 is deposited. The deposition process includes, for example, spin-on-coating, dip coating, brush coating, doctor blade coating, ink-jet dispensing, etc. The ILD 30 is formulated such that it is compatible with the underlying photoresist pattern features 32, 34 and 36, i.e., the application of the ILD 30 does not substantially alter the dimension and profile of the resist patterns 32, 34 and 36. After applying the ILD material, a post deposition baking step may be employed to remove unwanted components, such as solvent. When performed, the baking step is conducted at a temperature from 40° C. to 200° C., with a baking temperature from 60° C. to 140° C. being more preferred. The duration of the baking step varies from 10 seconds to 600 seconds and is not critical.

The ILD 30 includes any dielectric material compositions that are compatible with the pattern photoresist structures. In one embodiment, the ILD 30 may be used as deposited as a permanent ILD. In another embodiment, the ILD 30 may be cured to form a patterned permanent dielectric (e.g., the ILD 30 is a photo-patternable low k (PPLK) material). It is noted that the photo-patternable low k materials are subsequently converted into a low-k dielectric insulator during a post patterning cure process as described with reference to FIG. 5.

Referring to FIG. 4A, an alternate embodiment includes depositing a permanent dielectric layer 30' and forming contact holes 42', 44' and 46' by employing a mask and etch process. Instead of forming features 32, 34 and 36, the dielectric layer 30' is deposited, e.g., using a CVD process or the like. The dielectric layer 30' may include a silicon oxide, a silicon nitride, or any other dielectric layer. The dielectric layer 30' is then lithographically patterned using a mask and an etch process to form the contact holes 42', 44' and 46'. The etching process may include a reactive ion etch. Processing would continue as described with reference to FIG. 6.

Referring to FIG. 5, the ILD 30 of FIG. 4 includes the PPLK material, which is subjected to a cure process. The cured product of a PPLK material serves as a permanent on-chip dielectric insulator 38, referred to hereinafter as ILD 38. The photo-patternable low k material employed herein can be deposited from a liquid phase. In the present disclosure, the terms "cure" or "curing" are used interchangeable to refer one of the processes selected from a thermal cure, an electron beam cure, an ultra-violet (UV) cure, an ion beam cure, a plasma cure, a microwave cure or a combination thereof.

A "cured" product of a photo-patternable low k material is the product of the photo-patternable low k material after it has undergone one of the aforementioned cure processes. The "cured" product of a photo-patternable low k material is different from the photo-patternable low k material in chemical nature and physical, mechanical and electrical properties. The "cured" product is cured in place to form a unitary layer structure with hole patterns defined within the layer in advance by features (e.g., 32, 34, and 36).

The term "photo-patternable low k material" (or PPLK) includes a functionalized polymer, copolymer or blend including at least two of any combination of polymers and/or copolymers having one or more acid-sensitive imageable groups. The PPLK material acts as a photoresist and after curing it is converted into a dielectric material having a dielectric constant of about 4.3 or less. It is noted that when the PPLK material is comprised of a polymer, the polymer includes at least one monomer (to be described in greater detail below). When the PPLK material is comprised of a copolymer, the copolymer includes at least two monomers (to be described in greater detail below). The blends of polymers and/or copolymers include at least two of any combination of polymers and/or copolymers described herein.

The PPLK material is a photo-patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material that can be employed is a photo-patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material may also be a photo-patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Additionally, the PPLK material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally, the PPLK material may be a photo-patternable composition further comprising at least one microscopic pore generator (porogen). The pore generator may be or may not be photo/acid sensitive.

Illustrative polymers for the PPLK material include, but are not limited to, siloxane, silane, carbosilane, oxycarbosilane, silsesquioxane-type polymers including caged, linear, branched or combinations thereof. In one embodiment, the PPLK material is a photo-patternable composition comprising a blend of these photo/acid-sensitive polymers.

The PPLK material may be formed from a photo-patternable composition (negative-tone or positive-tone) that includes at least one of the above mentioned polymers, copolymers or blends, a photoacid generator, a base additive and a solvent used in a photoresist composition. When the PPLK material is a negative-tone photo-patternable material, it may be formed from a patternable composition optionally including an additional cross-linker. By "negative-tone" it is meant that the part of the PPLK material that is exposed to an actinic irradiation will not be removed by a conventional developer, while the unexposed part of the PPLK material is removed.

The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material is a positive-tone photo-patternable material, it is formed from a patternable composition that includes at least one of the above mentioned polymers, copolymers or blends wherein the polymers, copolymers or blends containing at least photo/acid imageable functional group to than positive-tone patterns, a photoacid generator, a base additive and a solvent used in a photoresist. By 'positive-tone" it is meant that the part of the PPLK material that is exposed to an actinic irradiation will be removed by a conventional developer, while the unexposed part of the PPLK material is not removed. The photoacid generators, base additives and solvents are well known to those skilled in the art.

Excess ILD 38 may be removed by dry etching, wet etching, polishing or other methods to expose the features 32, 34 and 36. This polishing or etching provides access to the resist pattern structures or features 32, 34 and 36 to enable removal. The resist features 32, 34 and 36 may be removed by a wet method, a dry method, heat, UV light or a combination thereof. In one embodiment, a wet method is employed with an appropriate developer. In another embodiment, a dry method is employed with an appropriate selective reactive ion etching that removes only the exposed resist. In yet another embodiment, a dry method is employed by using heat or UV irradiation to remove exposed resist. These selective removal methods leave openings 42, 44 and 46 within the ILD 38. Note that features 32, 34 and 36 may be formed from materials other than resist, e.g., dielectrics etc. and removed by appropriate etching processes.

The openings 42, 44 and 46 have the shapes of the pattern, which was previously created (e.g., 32, 34, 36). The curing of the ILD 30 may be performed with heat, UV, or E-beam (tone inversion in ILD) to form a permanent (cured) interconnect dielectric layer or ILD 38, which is employed to insulate conductive structures.

Depending on the material selection, ILD 30 may not need to be processed to become the permanent ILD 38 and may instead be the permanent ILD 30 upon its formation. If this is the case then FIG. 5 is optional as the ILD layer formed in FIG. 4 is sufficient.

Curing of the ILD 30 to become ILD 38, if needed, may be performed by a thermal cure, an electron beam cure, an ultraviolet (UV) cure, an ion beam cure, a plasma cure, a microwave cure or a combination thereof. The conditions for each of the curing processes are well known to those skilled in the art and any condition can be chosen as long as it converts the interlevel dielectric composition into a low k film and maintains pattern fidelity.

In one embodiment, an irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof. The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as in $N_2$, He and Ar. The UV/thermal cure temperature may be from 100° C. to 500° C., with a cure temperature from 300° C. to 450° C. being more common. The duration of the UV/thermal cure is from 0.5 min to 30 min with a duration from 1 min to 10 min being more common. The UV cure module is designed to have a very low oxygen content to avoid degradation of the resultant dielectric materials. This post-patterning cure, if performed, may be in different or the same tool cluster as that of the patterning step.

Figure 6:
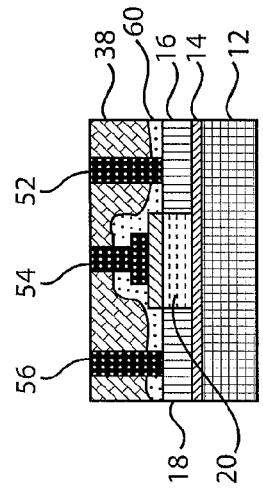
FIG. 6 is a cross-sectional view showing contact structures formed in the contact holes down to the gate electrode, source region and drain region in accordance with the present principles.

Referring to FIG. 6, a metallization process includes depositing a conductor into openings 42, 44 and 46 and over a top surface of ILD 38. The conductor may include copper, aluminum, tungsten, molybdenum, titanium, doped polysilicon, Al—Nd, Al—Mo, W—Mo or any other useful conductive material, or alloys/combinations thereof. The conductor may be deposited using chemical vapor deposition (CVD) or other deposition technique. The openings 42, 44, 46 are filled with the conductive material and a chemical-mechanical polish (CMP) is performed to remove excess conductor from the surface of dielectric layer ILD 38 (or ILD 30) to form conductive structures 52, 54, 56 (e.g., metal lines or contacts) in a single damascene process. Dual damascene processes are also contemplated. Other planarization processes may also be employed. Additional metallization and ILDs may be formed as needed using the process as described herein.

Referring to FIG. 7, a cross-sectional view of a partially fabricated device is shown in accordance with another embodiment. FIG. 7 begins with the structure depicted in FIG. 3. An antireflection coating (ARC) 60 is formed over the devices 10 including the gate electrode 26, the gate dielectric 28 and source region 16 and drain region 18. The ARC 60 may be a single layer, multilayer or a graded layer with a composition that varies along the vertical direction.

The ARC 60 provides at least some of the following: (i) acts as an antireflective coating (ARC) during a lithographic patterning process; (ii) withstands high-temperature integration processing (e.g., up to about 500° C.); (iii) prevents resist (e.g., the PPLK material) poisoning; (iv) provides sufficient etch selectivity between the PPLK material and the ARC layer 60; (v) serves as a permanent dielectric layer in a chip (low dielectric constant, e.g., k<5, more commonly k<3.6); (vi) is compatible with conventional integration processing and produces reliable hardware; and vii) may be employed to construct other features of the display device. For example, the ARC may be employed in other areas of the device, such as, a black matrix, contrast structures or other light blocking features employed around light emitting pixel elements or the like.

Antireflective coatings are known to those skilled in the art and include, for example, organic homopolymers or copolymers of polyesters, polyimides, polyacrylates, polymethacrylates, polysulfones, and amorphous carbon that satisfy all of the characteristics of ARC 60 mentioned above. The ARC 60 may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, spin-on techniques, dipping, etc. The ARC 60 may include atoms of M, carbon (C) and hydrogen (H), wherein M is at least one of Si, Ge, B, Sn, Fe, Ta, Ti, Ni, Hf and La.

When ARC 60 is a multilayer ARC, the deposition of each layer may be the same or a combination of deposition methods can be used. After applying ARC 60, particularly from a liquid phase, a post deposition baking step may be performed to remove unwanted components, such as solvent, and to effect crosslinking. The post deposition baking step of ARC 60 is typically, but not necessarily always, performed at a temperature from 80° C. to 300° C., with a baking temperature from 120° C. to 200° C. being more typical. Other post-deposition treatments may be performed.

After ARC 60 deposition, the ILD 30 is deposited over the ARC 60. As described above ILD 30 may include a permanent ILD layer as deposited or may include a PPLK layer, which may be cured for the permanent ILD layer. In one embodiment, the ILD 30 includes PPLK, and a reverse image process may be employed.

Figure 8:
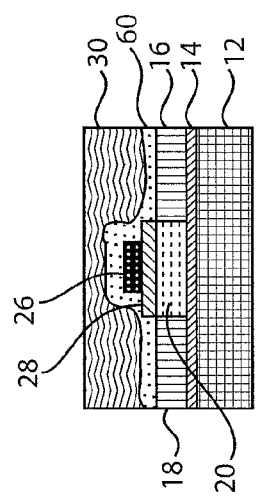
FIG. 8 is a cross-sectional view showing the interlevel dielectric layer and the antireflection coating etched down to the gate electrode, source region and drain region in accordance with the present principles.

Referring to FIG. 8, contact holes 42, 44, 46 are formed through the ILD 30. If a permanent ILD 30 is deposited, a patterned etch process may be employed to etch through the ILD 30. Then an ARC open process is performed to expose the source region 16, the gate electrode 26 and the drain region 18 to form contact holes 42, 44, 46. The ARC open process preferably includes an etching process that selectively etches the ARC 60 relative to the ILD 30. In providing the ARC 60, etching to form the contact holes 42, 44, 46 becomes easier since the ARC 60 acts as an etch stop layer. The etch processes employed may include reactive ion etch processes.

Figure 8A:
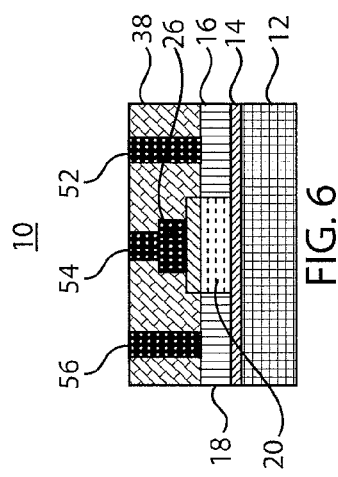
FIG. 8A is a cross-sectional view showing a permanent interlevel dielectric layer formed from a photo-patternable low dielectric constant material deposited over resist features formed on the structure of FIG. 3, the resist features to be decomposed and removed to form contact holes down to the gate electrode, source region and drain region through the antireflection coating in accordance with the present principles.

Referring to FIG. 8A, an alternate embodiment employs a reverse image PPLK processing step to form the contact holes 42, 44, 46. The resist may be applied and is patterned into features (e.g., 32, 34, 36 as described above) on top of the ARC 60. Next, the resist features are embedded in the PPLK material, and the PPLK is material cured (e.g., to form ILD 38). It should be understood that the ILD layer 38 is structurally formed as a unitary structure conforming to and embedding the features 32, 34, 36 therein upon curing. The cured ILD layer 38 is subjected to a planarization process to remove the PPLK material and expose the resist features 32, 34, 36. The resist features 32, 34, 36 are decomposed by a solvent to remove them, leaving behind holes bottoming on the ARC 60. Then, an etch open of the ARC 60 is performed as described above to form the contact holes 42, 44, 46.

Figure 9:
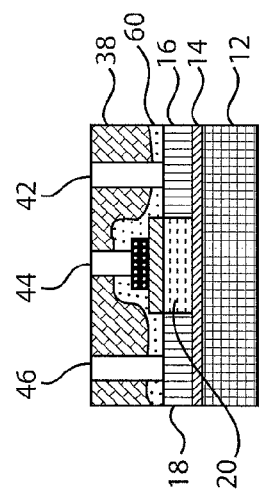
FIG. 9 is a cross-sectional view showing contact structures formed in the contact holes down to the gate electrode, source region and drain region in accordance with the present principles.

Referring to FIG. 9, a metallization process includes depositing a conductor into openings 42, 44 and 46 and over a top surface of ILD 30 (FIG. 8) or ILD 38 (FIG. 8A). The conductor may include copper, aluminum, tungsten, molybdenum, titanium, doped polysilicon, Al—Nd, Al—Mo, W—Mo or any other useful conductive material, or alloys/combinations thereof. The conductor may be deposited using chemical vapor deposition (CVD) or other deposition technique. The openings 42, 44, 46 are filled with the conductive material and a chemical-mechanical polish (CMP) is performed to remove excess conductor from the surface of dielectric layer ILD (30 or 38) to form conductive structures 52, 54, 56 (e.g., metal lines or contacts) in a single damascene process. Dual damascene processes are also contemplated. Other planarization processes may also be employed. Additional metallization and ILDs may be formed as needed using the process as described herein.

The structures as depicted in FIG. 6 and FIG. 9 are further processed to provide higher level metal lines and connections if needed. Although single damascene structures are depicted in FIGS. 6 and 9, dual damascene structures may be employed. In addition, other structures such as air gaps or dielectric barriers between nearby metallization structures may be employed. In liquid crystal displays, other structures may be formed concurrently with the thin film transistors of FIGS. 6 and 9. For example, pixels or subpixels, capacitors, etc. may be patterned along with the printing processes employed for forming the source, drain and channel regions (16, 18, 20). In other embodiments, the pixels or subpixels, capacitors, wiring lines, etc. may be concurrently formed with the contacts 42, 44, 46. In still other embodiments, the ARC 60 may be employed in other areas of the display device (as a black material or light absorbing material).

The present principles simplify process flow to form thin film transistors for liquid crystal displays or other applications. The present embodiments simplify process flow and reduce manufacturing costs by eliminating many CVD deposition processes. The flexibility and ease of manufacturing also translate to scalability for smaller dimension or higher resolution liquid crystal displays. Embodiments include planar thin film transistor structures, which are printable and may include a permanent ARC.

Figure 10:
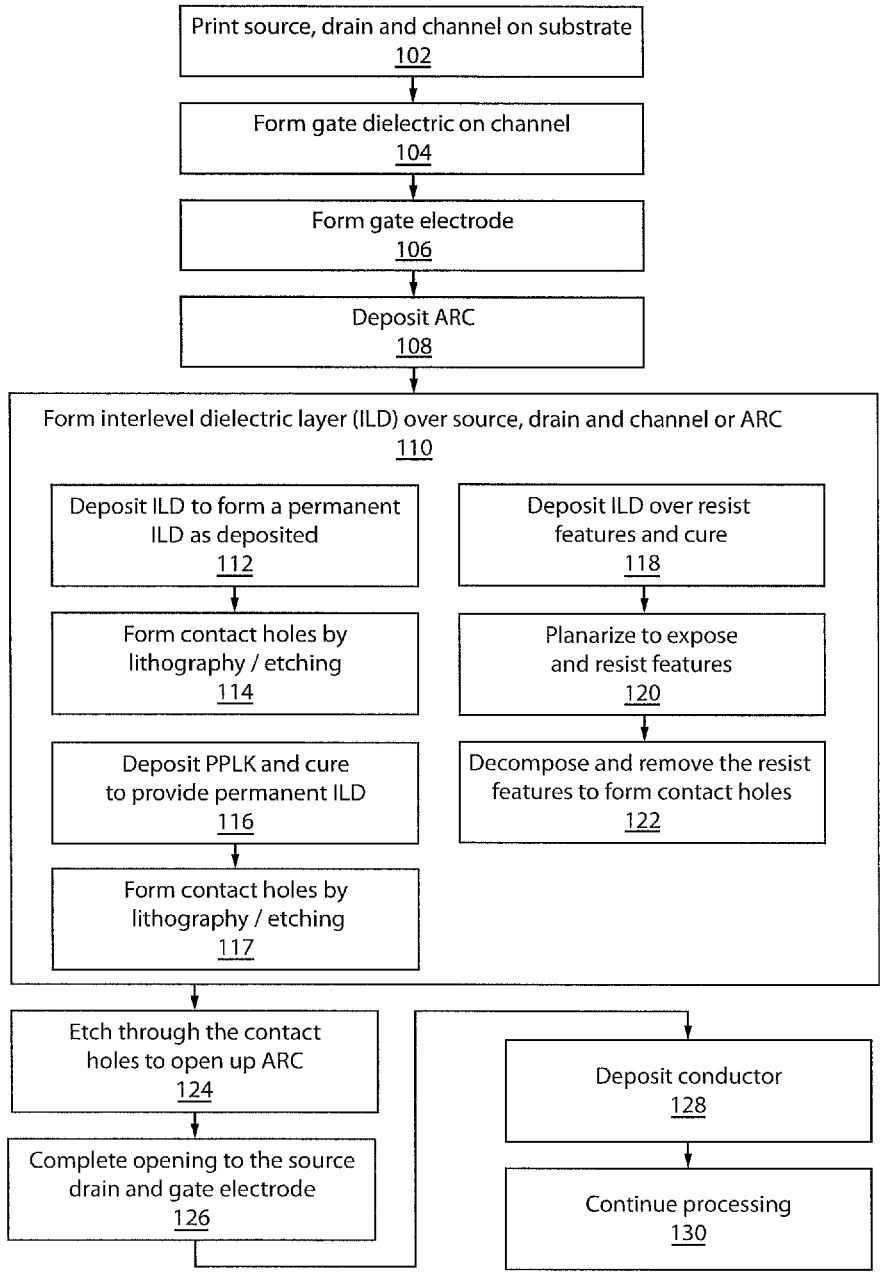
FIG. 10 is a block/flow diagram showing illustrative methods for forming a thin film transistor in accordance with illustrative embodiments.

Referring to FIG. 10, methods for fabricating a thin film transistor are illustratively shown. In block 102, source, drain and channel regions are printed on a passivated transparent substrate. The printing process may include, e.g., relief printing, reverse type offset printing, an ink jet printing, a screen printing, etc.

In block 104, a gate dielectric is formed and patterned over the channel region. In block 106, a gate conductor is formed and patterned over the gate dielectric. It should be understood that the gate dielectric and the gate electrode may be printed. In block 108, a permanent antireflective coating may be deposited over the source region, drain region and gate electrode (and other areas, if desired). The permanent antireflective coating is preferably formed from a material that is selectively etchable with respect to the interlevel dielectric layer and includes light spectra absorbing properties.

In block 110, an interlevel dielectric layer is formed over the source region, drain region and gate electrode or the permanent antireflective coating, if employed. In block 112, in one embodiment, the interlevel dielectric layer includes a permanent dielectric as formed. In block 114, the permanent dielectric is patterned using lithography to form contacts holes.

In another embodiment, a photo-patternable low dielectric constant (PPLK) material is deposited/formed for the interlevel dielectric material. This layer will subsequently be cured to form a permanent interlevel dielectric layer in block 116. The PPLK layer may then be lithography processed to form the contact holes (and to open up the ARC, if employed), in block 117.

In another embodiment, in block 118, the interlevel dielectric layer includes PPLK and may be deposited over resist features that are patterned over the source region, drain region and gate electrode or over the permanent antireflection coating, if present. The PPLK is cured over the resist features. The resist layer is developed to form the features having the same image as contact holes over the source region, drain region and gate electrode. The resist features provide a "form" for a reverse image for the formation of contact holes. In block 120, the resist features are exposed by planarization. The exposed features will be decomposed and removed to form the reverse image in block 122. In block 124, the permanent antireflection coating may be etched through the reverse image to form the openings.

In block 126, openings are now completed in the permanent antireflective coating and/or the interlevel dielectric layer to provide contact holes to the source region, drain region and gate electrode. In block 128, a conductor is deposited in the contact holes to electrically connect to the source region, drain region and gate electrode. In block 130, processing continues to form additional structures, such as wiring, e.g., dual damascene processing, additional dielectric layers, air gaps between conductive structures, rubbed layers, liquid crystal fill, housing assembly, etc. The thin film transistors as described herein may be employed in liquid crystal displays, other display devices, memory devices, etc.

Having described preferred embodiments for printed transistors and fabrication methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a thin film transistor, comprising:
   printing source, drain and channel regions on a passivated transparent substrate;
   forming a gate dielectric over the channel region;
   forming a gate conductor over the gate dielectric;
   depositing a permanent antireflective coating over the source region, drain region and gate electrode;
   forming an interlevel dielectric layer over the permanent antireflective coating;
   forming openings in the permanent antireflective coating and the interlevel dielectric layer to provide contact holes to the source region, drain region and gate electrode; and depositing a conductor in the contact holes to electrically connect to the source region, drain region and gate electrode.

2. The method as recited in claim 1, wherein printing includes one of relief printing, reverse type offset printing, an ink jet printing, a screen printing, nanoimprinting, embossing, micro-contact printing, replica molding, microtransfer molding, solvent-assisted micromolding, or thermal assisted embossing.

3. The method as recited in claim 1, wherein depositing a permanent antireflective coating includes forming the permanent antireflective coating from a material that is etchable selective to the interlevel dielectric layer.

4. The method as recited in claim 1, further comprising:
   depositing a resist layer over the permanent antireflection coating;
   developing the resist layer to form features having a contact hole image over the source region, drain region and gate electrode; and the step of forming openings includes:
   decomposing and removing the features formed in the interlevel dielectric layer to form a reverse image of contacts through the interlevel dielectric layer.

5. The method as recited in claim 4, further comprising etching the permanent antireflection coating through the reverse image to form the openings.

6. The method as recited in claim 1, wherein the interlevel dielectric layer includes a photo-patternable low dielectric constant (PPLK) material.

7. The method as recited in claim 6, wherein forming an interlevel dielectric layer includes curing the interlevel dielectric layer to form a permanent interlevel dielectric layer.

8. A method for fabricating a thin film transistor, comprising:
   printing source, drain and channel regions on a passivated transparent substrate;
   forming a gate dielectric over the channel region;
   forming a gate conductor over the gate dielectric;
   forming an interlevel dielectric layer from a photo-patternable low dielectric constant (PPLK) material;
   curing the PPLK material in the interlevel dielectric layer to provide a permanent dielectric layer;
   forming openings in the interlevel dielectric layer to provide contact holes to the source region, drain region and gate electrode; and
   depositing a conductor in the contact holes to electrically connect to the source region, drain region and gate electrode.

9. The method as recited in claim 8, wherein printing includes one of relief printing, reverse type offset printing, an ink-jet printing, a screen printing, nanoimprinting, embossing, micro-contact printing, replica molding, microtransfer molding, solvent-assisted micromolding, or thermal assisted embossing.

10. The method as recited in claim 8, further comprising:
    depositing a permanent antireflective coating over the source region, drain region and gate electrode and forming the openings through the permanent antireflective coating.

11. The method as recited in claim 10, wherein depositing the permanent antireflective coating includes forming the permanent antireflective coating from a material that is etchable selective to the interlevel dielectric layer.

12. The method as recited in claim 10, further comprising etching the permanent antireflection coating through the openings.

13. The method as recited in claim 8, further comprising:
    depositing a resist layer over the source region, drain region and gate electrode;
    developing the resist layer to form features having a contact hole image over the source region, drain region and gate electrode; and the step of forming openings includes:
    decomposing and removing the features formed in the interlevel dielectric layer to form a reverse image of contacts through the interlevel dielectric layer.

* * * * *